(12) United States Patent
Tiron et al.

(10) Patent No.: US 12,022,751 B2
(45) Date of Patent: Jun. 25, 2024

(54) METHOD FOR FABRICATING MOLDS FOR LITHOGRAPHY BY NANO-IMPRINTING

(71) Applicant: Commissariat à l'Energie Atomique et aux Energies Alternatives, Paris (FR)

(72) Inventors: Raluca Tiron, Grenoble (FR); Gaëlle Chamiot-Maitral, Grenoble (FR); Elisa Vianello, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 460 days.

(21) Appl. No.: 17/324,486

(22) Filed: May 19, 2021

(65) Prior Publication Data
US 2021/0367149 A1 Nov. 25, 2021

(30) Foreign Application Priority Data
May 19, 2020 (FR) ..................... 20 05118

(51) Int. Cl.
*G03F 7/00* (2006.01)
*G06N 3/044* (2023.01)
(Continued)

(52) U.S. Cl.
CPC ......... *H10N 70/011* (2023.02); *G03F 7/0002* (2013.01); *G06N 3/044* (2023.01);
(Continued)

(58) Field of Classification Search
None
See application file for complete search history.

(56) References Cited

U.S. PATENT DOCUMENTS

| 7,114,938 B2 * | 10/2006 | Chou | ............... B29C 59/022 |
| | | | 425/150 |
| 7,790,350 B2 * | 9/2010 | Breyta | ............. H01L 21/31144 |
| | | | 430/312 |

(Continued)

FOREIGN PATENT DOCUMENTS

| CN | 103177936 A | * | 6/2013 | |
| CN | 105713189 A | * | 6/2016 | ............. C08G 64/18 |

(Continued)

OTHER PUBLICATIONS

Li et al., Ordered Block-Copolymer Assembly Using Nanoimprint Lithography, Aug. 13, 2004, American Chemical Society, col. 4, No. 9, 1633-1636 (Year: 2004).*

(Continued)

*Primary Examiner* — Timothy Kennedy
(74) *Attorney, Agent, or Firm* — Oblon, McClelland, Maier & Neustadt, L.L.P.

(57) ABSTRACT

This method comprises the steps:
a) provide a substrate (1);
b) form a layer of a first block copolymer on the substrate (1), by a technique of self-assembly such that the first layer comprises a series of first lithographic patterns extending in a first direction;
c) create a first mold comprising impressions formed from the series of first lithographic patterns;
d) provide a structured layer comprising a series of patterns (30), conforming to the series of first lithographic patterns, and extending in the first direction;
e) form a layer (4) of a second block copolymer (40, 41) on the structured layer by a technique of self-assembly such that the second layer (4) comprises a series of second lithographic patterns (40) extending in a second direction perpendicular to the first direction;

(Continued)

f) create a second mold comprising impressions formed from the series of second lithographic patterns (40).

7 Claims, 7 Drawing Sheets

(51) Int. Cl.
    *G06N 3/063*     (2023.01)
    *H10N 70/00*     (2023.01)

(52) U.S. Cl.
    CPC ........... *G06N 3/063* (2013.01); *H10N 70/826* (2023.02); *H10N 70/841* (2023.02)

(56) References Cited

U.S. PATENT DOCUMENTS

| | | | | |
|---|---|---|---|---|
| 7,981,533 | B2* | 7/2011 | Albrecht | B82Y 10/00 |
| | | | | 428/800 |
| 9,182,673 | B2* | 11/2015 | Wuister | G03F 7/2024 |
| 9,377,683 | B2* | 6/2016 | Gao | G03F 7/0002 |
| 9,434,093 | B2* | 9/2016 | Hahm | B29C 33/3878 |
| 2003/0034329 | A1* | 2/2003 | Chou | B29C 43/003 |
| | | | | 438/735 |
| 2009/0035668 | A1* | 2/2009 | Breyta | B82Y 10/00 |
| | | | | 430/327 |
| 2009/0179002 | A1* | 7/2009 | Cheng | B82Y 10/00 |
| | | | | 427/256 |
| 2010/0046079 | A1* | 2/2010 | Yoon | G02B 3/0012 |
| | | | | 174/250 |
| 2011/0147983 | A1* | 6/2011 | Cheng | B82Y 40/00 |
| | | | | 264/220 |
| 2012/0082825 | A1* | 4/2012 | Zu | C23F 1/08 |
| | | | | 216/13 |
| 2014/0116980 | A1* | 5/2014 | Wuister | G03F 7/16 |
| | | | | 427/256 |
| 2014/0287083 | A1* | 9/2014 | Gao | G03F 7/0002 |
| | | | | 216/40 |
| 2015/0314488 | A1* | 11/2015 | Hahm | B29C 33/3878 |
| | | | | 216/52 |
| 2016/0297986 | A1* | 10/2016 | Onses | G03F 7/0002 |
| 2017/0054112 | A1 | 2/2017 | Sato et al. | |
| 2019/0393412 | A1 | 12/2019 | Vianello et al. | |
| 2020/0012018 | A1 | 1/2020 | Takeshita et al. | |
| 2020/0371437 | A1 | 11/2020 | Chevalier et al. | |

FOREIGN PATENT DOCUMENTS

| | | | | |
|---|---|---|---|---|
| CN | 109698125 A | * | 4/2019 | |
| EP | 3 579 151 A1 | | 12/2019 | |
| FR | 3 074 180 A1 | | 5/2019 | |
| JP | 2014-066976 A | | 4/2014 | |
| WO | WO-2007046110 A1 | * | 4/2007 | ......... B81C 1/00031 |

OTHER PUBLICATIONS

French Preliminary Search Report dated Mar. 1, 2021 in French Application 20 05118 filed on May 19, 2020, citing documents AA-AD & AO-AQ therein, 11 pages (with English Translation of Categories of Cited Documents & Written Opinion).

Wu et al., "One-kilobit cross-bar molecular memory circuits at 30-nm half-pitch fabricated by nanoimprint lithography", Applied Physics A—Materials Science & Processing, 80, 2005, pp. 1173-1178.

* cited by examiner

METHOD FOR FABRICATING MOLDS FOR LITHOGRAPHY BY NANO-IMPRINTING

TECHNICAL FIELD

The invention relates to the technical field of the fabrication of molds for lithography by nano-imprinting.

The invention is notably applicable in the fabrication of a recurrent neural network computer.

Recurrent neural networks are networks of artificial neurons where the connections between the units form at least one cycle in the sense of the theory of graphs. More precisely, one application targeted relates to the recurrent neural networks driven by the "Reservoir computing" paradigm. This paradigm is a highly non-linear dynamic system comprising:
- an input layer;
- a hidden layer, called reservoir, equipped with randomly fixed recurrent connections;
- an output layer (called "readout").

The principle of this paradigm is to project the input layer toward the reservoir, then to modify the connections going from the reservoir toward the output layer by a supervised learning.

In other words, one application targeted relates to a computer which is a physical or hardware implementation of the "Reservoir computing" paradigm. Such a computer notably allows the classification of tasks, the extraction of characteristics, the tracking of objects, the prediction of movements in robotics, voice recognition and sound recognition.

PRIOR ART

A method for fabricating a recurrent neural network computer, known from the prior art, notably from the document "*Atomic switch networks—nanoarchitectonic design of a complex system for natural computing*", E. C. Dem is et al., Nanotechnology, 26, 204003, 2015, comprises a step for random growth of nanowires of silver on a structured platinum electrode. The random character is obtained by a preliminary step for formation of microspheres of copper on the structured electrode. The microspheres of copper form a seed layer for the nanowires of silver. The method comprises a step for sulfuration of the nanowires of silver in such a manner as to obtain structures of the type $Ag/Ag_2S/Ag$. Such structures form resistive memory cells of the atomic switch type.

Such a method of the prior art allows the fabrication of a computer which is a physical implementation of the "Reservoir computing" paradigm. However, such a method of the prior art is not entirely satisfactory given that the choice of the materials for the resistive memory is restricted. Indeed, it is necessary to choose a pair of compatible materials, of the electrical conductor/dielectric type, for the formation of the nanowires and of the resistive memory cells, in this case $Ag/Ag_2S$.

A structure is sought of the first electrode/memory layer/second electrode type, allowing freedom on the choice of the material of the memory layer, and introducing a random character necessary in the "Reservoir Computing" paradigm, in other words for example:
- recurrent connections randomly fixed in the reservoir;
- a stochastic number of units (a unit corresponding to a cell of resistive memory, situated at an intersection between the first and second electrodes);
- a random latency time between the units (e.g. a random distance between the units);
- a random weight of the units by a random conductance of the cells of the resistive memory (the cells of the resistive memory being formed by the areas of intersection between the memory layer and the first and second electrodes).

DESCRIPTION OF THE INVENTION

The invention aims to overcome, fully or in part, the aforementioned drawbacks. For this purpose, the subject of the invention is a method for fabricating first and second molds for lithography by nano-imprinting, comprising the steps:

a) provide a substrate comprising a first neutralization layer;

b) form a layer of a first block copolymer on the first neutralization layer by a technique of self-assembly, the first block copolymer comprising first and second monomers, the first neutralization layer having an identical affinity for each of the first and second monomers; then selectively remove the second monomer such that the layer of the first block copolymer comprises a series of first lithographic patterns with a random structure extending in a first direction, each of the first lithographic patterns being formed in the first monomer;

c) create a first mold comprising impressions formed from the series of first lithographic patterns;

d) provide a structured layer comprising a series of patterns, conforming to the series of first lithographic patterns, and extending in the first direction, then coat the structured layer with a second neutralization layer;

e) form a layer of second block copolymer on the second neutralization layer by a technique of self-assembly, the second block copolymer comprising third and fourth monomers, the second neutralization layer having an identical affinity for each of the third and fourth monomers; then selectively remove the fourth monomer such that the layer of the second block copolymer comprises a series of second lithographic patterns with a random structure extending in a second direction perpendicular to the first direction, each of the second lithographic patterns being formed in the third monomer;

f) create a second mold comprising impressions formed from the series of second lithographic patterns.

Thus, such fabricated first and second molds allow a resin to be structured with a random character coming from the self-assembly of the block copolymer. The formation of first and second electrodes is therefore made possible by a technique of lithography by nano-imprinting NIL (acronym for "NanoImprint Lithography"), respectively structured by virtue of first and second molds. Furthermore, the fact that the series of second lithographic patterns is perpendicular to the series of first lithographic patterns allows the number of random intersections (in transverse projections) between the first and second electrodes to be maximized and, at the same time, the density of resistive memory cells to be maximized, each cell being situated at an intersection between the first and second electrodes.

Furthermore, the memory layer of the computer will be able to be formed independently of the first and second electrodes, which allows a freedom on the choice of the material of the memory layer.

Definitions

"Substrate" is understood to mean a self-supporting physical carrier, conventionally a wafer cut from a crystalline ingot of semiconductor material.

"Neutralization layer" is understood to mean a layer formed from a material (e.g. a polymer) not exhibiting any preferential interaction with one of the blocks/monomers composing the block copolymer. The first neutralization layer does not therefore exhibit any preferential interaction with the first or second monomers of the first block copolymer. The second neutralization layer does not therefore exhibit any preferential interaction with the third or fourth monomers of the second block copolymer. The first neutralization layer allows the interface energies between the substrate and the layer of the first block copolymer to be neutralized. In other words, the first neutralization layer is a functionalization layer allowing the surface energies of the substrate to be controlled. The second neutralization layer allows the interface energies between the structured layer and the layer of the second block copolymer to be neutralized. In other words, the second neutralization layer is a functionalization layer allowing the surface energies of the structured layer to be controlled.

"Structured layer" is understood to mean a layer having a discontinuous surface bounding a set of patterns.

The phrase "conforming to the series of first lithographic patterns" is understood to mean that the series of patterns of the structured layer conserves the periodicity of the series of first lithographic patterns.

The method according to the invention may comprise one or more of the following features.

According to one feature of the invention, the substrate provided during the step a) is coated with an oxide layer, preferably of $SiO_2$, on which the first neutralization layer is formed; and the step c) is preceded by a step $c_0$) consisting in etching the first neutralization layer and the oxide layer through the series of first lithographic patterns.

Thus, one advantage offered by the etched oxide layer is to improve the quality of the first mold created during the step c), by reducing its defectivity. Furthermore, the block copolymer possesses the property of self-assembling into dense networks of nanometric objects with the capacity of forming a lithography mask, which allows the oxide layer to be readily etched through the series of first lithographic patterns.

According to one feature of the invention, the structured layer provided during the step d) has a thickness in the range between 5 nm and 15 nm.

Thus, one advantage offered by such a thickness is to obtain a surface topology of the structured layer favorable to the efficiency of the technique of self-assembly executed during the step e).

According to one feature of the invention, the step d) comprises the steps:
$d_0$) provide a layer, intended to be structured, on a carrier substrate;
$d_1$) deposit a thermoplastic resin on the layer;
$d_2$) apply the impressions of the first mold created during the step c) onto the thermoplastic resin, at a temperature adapted to shape the thermoplastic resin;
$d_3$) solidify the thermoplastic resin shaped during the step $d_2$) in such a manner as to obtain a lithography mask;
$d_4$) etch the layer through the lithography mask obtained during the step $d_3$) in such a manner as to structure the layer.

Thus, one advantage offered is to be able to obtain by NIL, by means of the first mold created during the step c), a structured layer comprising a series of patterns, conforming to the series of first lithographic patterns, and extending in the first direction.

According to one feature of the invention, the step d) comprises the steps:
$D_0$) provide a layer, intended to be structured, sandwiched between the substrate and the oxide layer;
$D_1$) eliminate the series of first lithographic patterns and the first neutralization layer, the step $D_1$) being executed after the step $c_0$) such that the oxide layer etched during the step $c_0$) forms a lithography mask;
$D_2$) etch the layer through the lithography mask formed during the step $D_1$), in such a manner as to structure the layer;
$D_3$) remove the oxide layer.

Thus, one advantage offered is to be able to follow on to the creation of the second mold using the same substrate provided during the step a).

According to one feature of the invention, the layer provided during the step $D_0$) is formed from a material chosen so as to allow a selective etch of the oxide layer, the material preferably being TiN.

The phrase "allow a selective etch" is understood to mean that the oxide layer may be etched without etching the layer provided during the step $D_0$). In practice, an etching agent will be chosen such that the etch rate of the oxide is at least ten times higher than that of the material of the layer provided during the step $D_0$).

Thus, one advantage offered is to be able to remove the oxide layer without degrading the layer provided during the step $D_0$).

According to one feature of the invention, the first and second block copolymers are selected from amongst:
polystyrene and polymethylmethacrylate, denoted PS-PMMA;
polystyrene and polylactic acid, denoted PS-PLA;
polystyrene and poly(ethylene oxide), denoted PS-PEO;
polystyrene and polydimethylsiloxane, denoted PS-PDMS;
polystyrene, polymethylmethacrylate, and poly(ethylene oxide), denoted PS-PMMA-PEO;
polystyrene and poly(2-vinyl pyridine), denoted PS-P2VP.

Another subject of the invention is a method for fabricating a recurrent neural network computer, comprising the successive steps:
a') provide a substrate comprising a first electrode;
$b'_1$) deposit a thermoplastic resin onto the first electrode;
$b'_2$) apply the impressions of the first mold, fabricated by a method according to the invention, onto the thermoplastic resin, at a temperature adapted to shape the thermoplastic resin;
$b'_3$) solidify the thermoplastic resin shaped during the step $b'_2$), in such a manner as to obtain a lithography mask;
$b'_4$) etch the first electrode through the lithography mask obtained during the step $b'_3$), in such a manner as to structure the first electrode;
$b'_5$) remove the thermoplastic resin;
c') form a memory layer, of the resistive memory type, on the first structured electrode during the step $b'_4$);
d') form a second electrode on the memory layer;
$e'_1$) deposit a thermoplastic resin on the second electrode;

e'$_2$) apply the impressions of the second mold, fabricated by a method according to the invention, onto the thermoplastic resin, at a temperature adapted to shape the thermoplastic resin;

e'$_3$) solidify the thermoplastic resin shaped during the step e'$_2$), in such a manner as to obtain a lithography mask;

e'$_4$) etch the second electrode through the lithography mask obtained during the step e'$_3$), in such a manner as to structure the second electrode;

e'$_5$) remove the thermoplastic resin.

Thus, such a method according to the invention allows first and second electrodes to be randomly structured by a technique of lithography by nano-imprinting NIL (acronym for "NanoImprint Lithography"), by virtue of the first and second molds, respectively. The fact that the impressions of the first mold are perpendicular to the impressions of the second mold allows the number of random intersections (in transverse projections) between the first and second electrodes to be maximized and, at the same time, the density of resistive memory cells to be maximized, each cell being situated at an intersection between the first and second electrodes.

Furthermore, the memory layer of the computer is formed independently of the first and second electrodes, which allows a freedom on the choice of the material of the memory layer.

Definitions

"Memory layer" is understood to mean a layer or a plurality of sub-layers (for example formed from a material of the oxide type or of the chalcogenide type) forming, with the first and second electrodes, a resistive memory (ReRam for "Resistive random-access memory"). More precisely, the cells of the resistive memory are situated at the intersections between the first and second electrodes.

The method according to the invention may comprise one or more of the following features.

According to one feature of the invention, the memory layer formed during the step c') is formed from at least one material selected from amongst HfO$_2$, Al$_2$O$_3$, SiO$_2$, ZrO, an oxide of titanium, a chalcogenide, Ta$_2$O$_5$.

According to one feature of the invention, the first and second electrodes are formed from at least one material selected from amongst Ti, TiN, Pt, Zr, Al, Hf, Ta, TaN, C, Cu, Ag.

According to one feature of the invention, the method comprises a step f) consisting in forming an encapsulation layer on the second structured electrode during the step e'$_4$), the step f) being executed after the step e'$_5$).

Thus, one advantage offered is the protection of the computer from the air and from humidity.

According to one feature of the invention, the first electrode structured during the step b'$_4$) has a pitch, denoted p, and in which the step c') is executed such that the memory layer has a thickness, denoted E, verifying:

$p/2 \leq E \leq p$.

Thus, such a thickness E of the memory layer allows a quasi-plane surface topology to be obtained in such a manner as to facilitate the formation of the second electrode during the step d'), while at the same time avoiding a chemical-mechanical polishing step.

Another subject of the invention is a recurrent neural network computer, obtained by a method according to the invention.

BRIEF DESCRIPTION OF THE DRAWINGS

Other features and advantages will become apparent in the detailed descriptions of various embodiments of the invention, the description comprising examples and references to the appended drawings.

Figure 1:
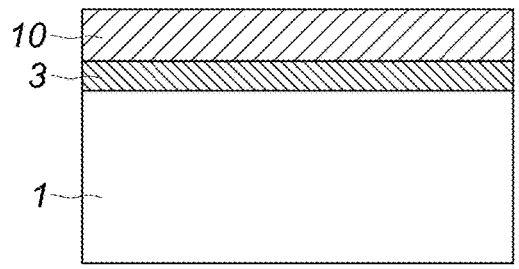
FIG. 1 is a schematic cross-sectional view illustrating one step of a method for fabricating a first mold according to the invention.
Figure 2A:
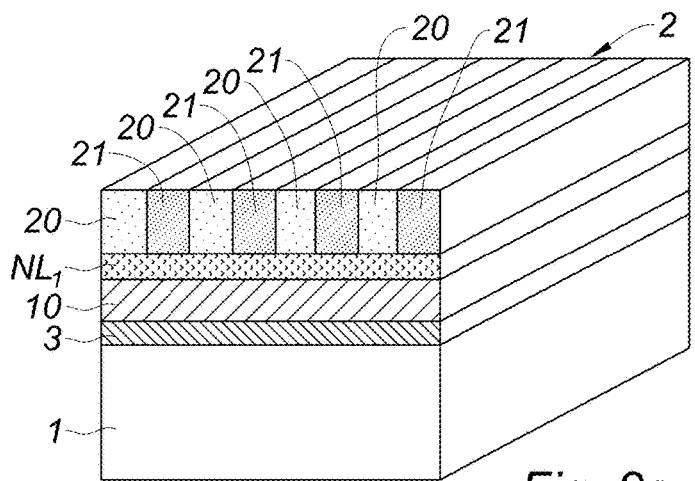
FIG. 2a is a schematic perspective view illustrating one step of a method for fabricating a first mold according to the invention.
Figure 2B:
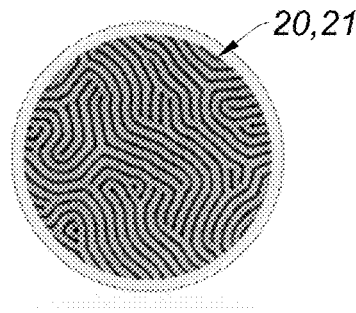
FIG. 2b, associated with FIG. 2a, is a partial schematic view from above illustrating the morphology of the layer of the first block copolymer.

It should be noted that the drawings described hereinbefore are schematic and are not to scale for the sake of readability. The cross-sections are applied along the normal to the surface of the substrate.

DETAILED DESCRIPTION OF THE EMBODIMENTS

For the sake of simplicity, identical elements or elements providing the same function will carry the same references for the various embodiments.

One subject of the invention is a method for fabricating first and second molds M$_1$, M$_2$ for lithography by nano-imprinting, comprising the steps:

a) provide a substrate 1 comprising a first neutralization layer NL$_1$;

b) form a layer 2 of a first block copolymer 20, 21 on the first neutralization layer NL$_1$ by a technique of self-assembly, the first block copolymer 20, 21 comprising first and second monomers 20, 21, the first neutralization layer NL$_1$ having an identical affinity for each of the first and second monomers 20, 21; then selectively remove the second monomer 21 such that the layer 2 of the first block copolymer 20, 21 comprises a series of first lithographic patterns 20 with a random structure extending in a first direction, each of the first lithographic patterns 20 being formed in the first monomer 20;

c) create a first mold $M_1$ comprising impressions $M_{10}$ formed from the series of first lithographic patterns 20;

d) provide a structured layer 3 comprising a series of patterns 30, conforming to the series of first lithographic patterns 20 and extending in the first direction, then coat the structured layer with a second neutralization layer $NL_2$, e) form a layer 4 of a second block copolymer 40, 41 on the second neutralization layer $NL_2$ by a technique of self-assembly, the second block copolymer 40, 41 comprising third and fourth monomers 40, 41, the second neutralization layer $NL_2$ having an identical affinity for each of the third and fourth monomers 40, 41; then selectively remove the fourth monomer 41 such that the layer 4 of the second block copolymer 40, 41 comprises a series of second lithographic patterns 40 with a random structure extending in a second direction perpendicular to the first direction, each of the second lithographic patterns 40 being formed in the third monomer 40;

f) create a second mold $M_2$ comprising impressions $M_{20}$ formed from the series of second lithographic patterns 40.

Substrate Provided During the Step a)

As illustrated in FIG. 1, the substrate 1 provided during the step a) is advantageously coated with an oxide layer 10, preferably of $SiO_2$, on which the first neutralization layer $NL_1$ is formed. The oxide layer 10 may have a thickness in the range between 40 nm and 50 nm.

The substrate 1 provided during the step a) may be made of Si.

Formation of the Layer of the First Block Copolymer

The first block copolymer 20, 21 of the layer 2 is advantageously selected from amongst:
  polystyrene and polymethylmethacrylate, denoted PS-PMMA;
  polystyrene and polylactic acid, denoted PS-PLA;
  polystyrene and poly(ethylene oxide), denoted PS-PEO;
  polystyrene and polydimethylsiloxane, denoted PS-PDMS;
  polystyrene, polymethylmethacrylate, and poly(ethylene oxide), denoted PS-PMMA-PEO;
  polystyrene and poly(2-vinyl pyridine), denoted PS-P2VP.

The first and second monomers 20, 21 of the first block copolymer 20, 21 are different compounds.

The first neutralization layer $NL_1$ is preferably formed from a polymer having an identical affinity for each of the first and second monomers 20, 21. The first neutralization layer $NL_1$ is preferably grafted onto the substrate 1. "Grafted" is understood to mean the formation of covalent bonds between the substrate 1 and the chains of the polymer of the first neutralization layer $NL_1$. The molar weight of the polymer of the first neutralization layer $NL_1$ is advantageously chosen such that the first neutralization layer $NL_1$ has a thickness of less than 10 nm (preferably of the order of 5 nm). The step for formation of the first neutralization layer $NL_1$ may be executed by means of a heat treatment, such as an annealing, or by photoreticulation. By way of example, when the first block copolymer 20, 21 is polystyrene-b-poly(methylmethacrylate), denoted PS-b-PMMA, of lamellar form, the polymer of the first neutralization layer $NL_1$ is advantageously polystyrene-r-poly(methylmethacrylate), denoted PS-r-PMMA, preferably comprising 50% by weight of PS and 50% by weight of PMMA. The step for formation of the first neutralization layer $NL_1$ preferably begins by a spin-coating deposition. This spin-coating deposition may be executed by diluting the polymer of the first neutralization layer $NL_1$ in an organic solvent. When the polymer of the first neutralization layer $NL_1$ is PS-r-PMMA, the organic solvent may be polypropylene glycol monomethylic ether acetate, denoted PGMEA. The solution of the polymer of the first neutralization layer $NL_1$, diluted in the organic solvent, may have a concentration by weight of the order of 2%. The step for formation of the first neutralization layer $NL_1$ may continue with an annealing at a temperature of the order of 250° C. for a duration of the order of 2 minutes. The annealing may be executed on a heating table or in an oven. When the polymer of the first neutralization layer $NL_1$ can be reticulated, such an annealing allows the reticulation of said polymer. The step for formation of the first neutralization layer $NL_1$ may subsequently comprise a rinse step during which the surplus of polymer of the first neutralization layer $NL_1$ is removed by means of a solvent. When the polymer of the first neutralization layer $NL_1$ is PS-r-PMMA, the solvent is preferably PGMEA.

Figure 3:
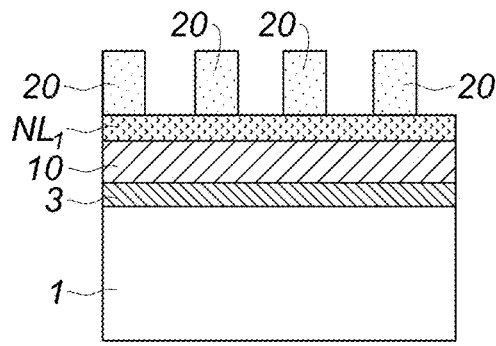
FIG. 3 and FIG. 4 are cross-sectional schematic views illustrating steps of a method for fabricating a first mold according to the invention.

The first block copolymer 20, 21 is preferably formed during the step b) with a lamellar morphology, the lamellae extending in the first direction. The molar weight of the first block copolymer 20, 21 is chosen in such a manner as to form, after self-assembly, periodic patterns (in the second direction) with a pitch in the range between 10 nm and 100 nm. The step b) is preferably executed by a spin-coating deposition. The spin-coating deposition may be executed by diluting the first block copolymer 20, 21 in an organic solvent. When the first block copolymer 20, 21 is formed from PS-b-PMMA, the organic solvent may be PGMEA. The solution of the first block copolymer 20, 21, diluted in the organic solvent, may have a concentration by weight of the order of 2%. The step b) comprises an annealing allowing the self-assembly of the first block copolymer PS-b-PMMA. The annealing is preferably executed at a temperature of the order of 220° C. for a duration of the order of 5 minutes. As illustrated in FIG. 3, the step b) comprises a selective removal of the second monomer 21 of the first block copolymer 20, 21, here a selective removal of the PMMA, in such a manner as to only conserve the series of first lithographic patterns 20 formed from PS. The selective removal of the PMMA may be executed according to an annealing, by exposing the layer 2 of the first block copolymer 20, 21 to ultraviolet radiation (e.g. at a wavelength of 172 nm), followed by a rinse with acetic acid or with isopropanol. The selective removal of the PMMA may also be executed by means of a selective plasma.

Creation of the First Mold

Figure 4:
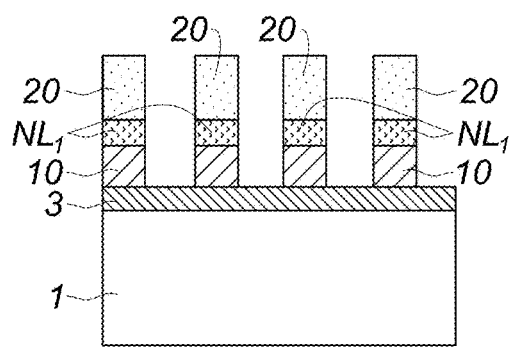

As illustrated in FIG. 4, when the substrate 1 provided during the step a) is coated with an oxide layer 10, the step c) is advantageously preceded by a step $c_0$) consisting in etching the first neutralization layer $NL_1$ and the oxide layer 10 through the series of first lithographic patterns 20. It is possible, at this stage, to eliminate the first monomer 20 forming the first lithographic patterns 20, together with the residues of the first neutralization layer $NL_1$, since the first lithographic patterns 20 have been transferred into the oxide layer 10. This elimination of the first monomer 20 and of the residues of the first neutralization layer $NL_1$ may be executed by a selective etch with respect to the oxide layer 10 and to the substrate 1 (and, potentially, the layer 3 intended to be structured).

The step c) is executed by a technique known to those skilled in the art, such as described in Chapter 2 of the book "*Nano Lithography*", edited by Stefan Landis, ISBN: 978-1-118-62170-7.

Figure 5A:
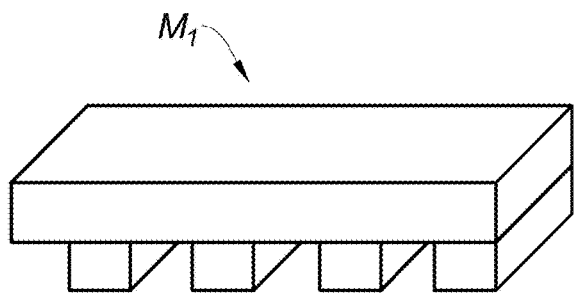
FIG. 5a is a perspective schematic view of a first mold created by a method according to the invention.
Figure 5B:
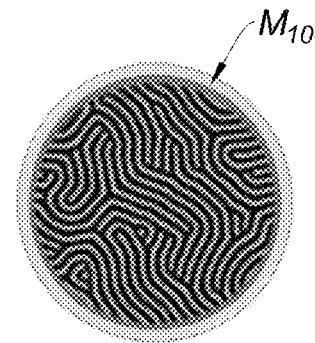
FIG. 5b, associated with FIG. 5a, is a partial schematic view illustrating the impressions of the first mold created.

The first mold $M_1$ (illustrated in FIG. 5a) is created during the step c) from a material of the polymer type.

Structured Layer Provided During the Step d)

The structured layer 3 provided during the step d) advantageously has a thickness in the range between 5 nm and 15 nm.

Figure 6:
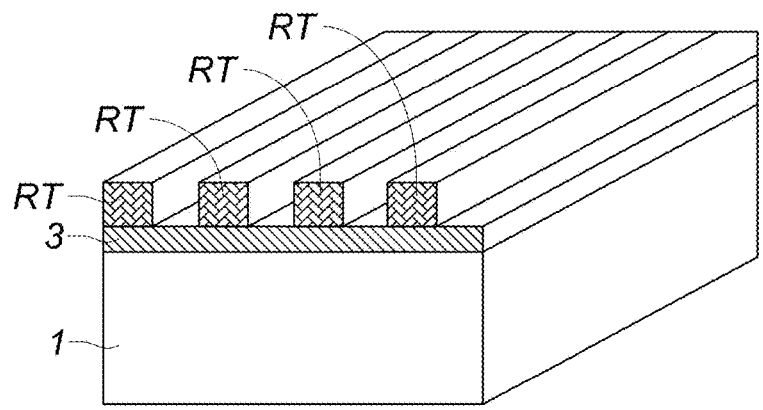
FIG. 6 and FIG. 7a are perspective schematic views illustrating steps of a method for fabricating a second mold according to the invention.
Figure 7A:
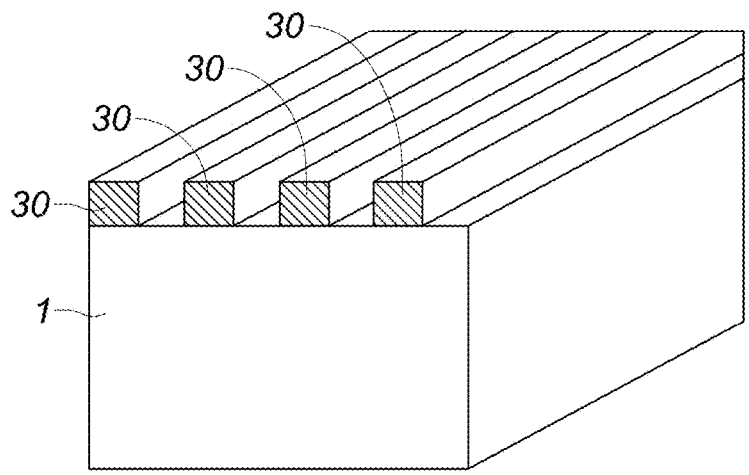
Figure 7B:
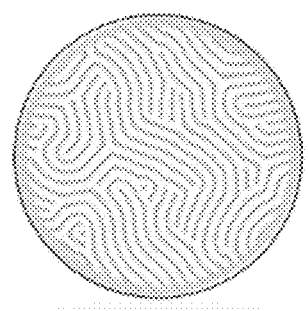
FIG. 7b, associated with FIG. 7a, is a partial schematic view from above illustrating the morphology of the structured layer.
Figure 8A:
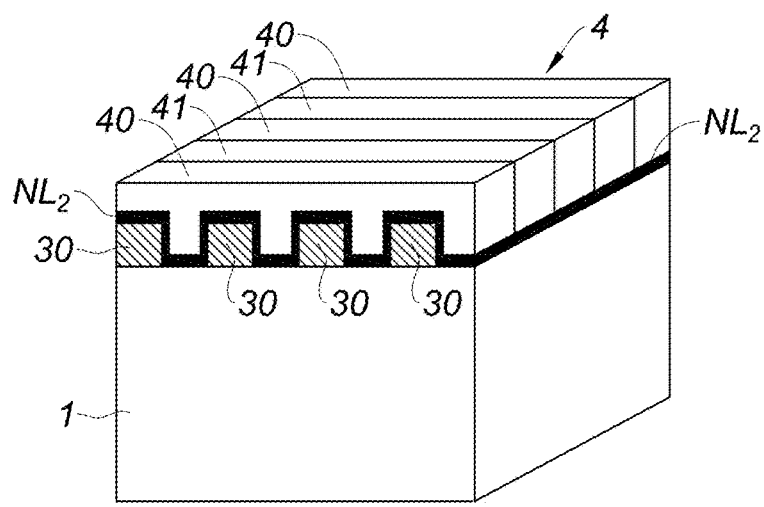
FIG. 8a and FIG. 9a are perspective schematic views illustrating steps of a method for fabricating a second mold according to the invention.
Figure 8B:
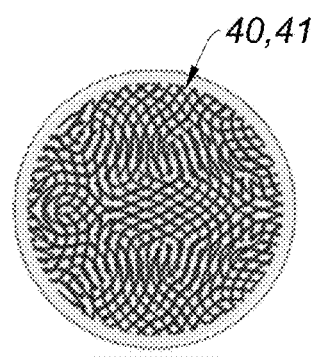
FIG. 8b, associated with FIG. 8a, is a partial schematic view from above illustrating the morphology of the layer of the second block copolymer.

The step d) advantageously comprises the steps:
$d_0$) provide a layer 3, intended to be structured, on a carrier substrate 1 (for example made of silicon);
$d_1$) deposit a thermoplastic resin RT on the layer 3;
$d_2$) apply the impressions $M_{10}$ of the first mold $M_1$ created during the step c) onto the thermoplastic resin RT, at a temperature adapted to shape the thermoplastic resin RT;
$d_3$) solidify the thermoplastic resin RT shaped during the step $d_2$), in such a manner as to obtain a lithography mask (illustrated in FIG. 6);
$d_4$) etch the layer 3 through the lithography mask obtained during the step $d_3$), in such a manner as to structure the layer 3 (illustrated in FIG. 7a).

According to one variant, the step d) may comprise the steps:
$D_0$) provide a layer 3, intended to be structured, sandwiched between the substrate 1 and the oxide layer 10;
$D_1$) eliminate the series of first lithographic patterns 20 and the first neutralization layer $NL_1$, the step $D_1$) being executed after the step $c_0$) such that the oxide layer 10 etched during the step $c_0$) forms a lithography mask;
$D_2$) etch the layer 3 through the lithography mask formed during the step $D_1$), in such a manner as to structure the layer 3;
$D_3$) remove the oxide layer 10.

As illustrated in FIG. 1, when the substrate 1 provided during the step a) is coated with an oxide layer 10, the layer 3 provided during the step $D_0$) is advantageously sandwiched between the substrate 1 and the oxide layer 10. The step $D_1$) may be executed by a selective etch with respect to the oxide layer 10 and to the layer 3 intended to be structured. The step $D_2$) may be executed by a selective etch of the layer 3 with respect to the substrate 1, using as etch mask the series of first lithographic patterns 20 transferred into the oxide layer 10 during the step $c_0$). The step $D_3$) may be executed by a selective etch of the oxide layer 10 with respect to the substrate 1 and to the structured layer 3. The layer 3 provided during the step $D_0$) is advantageously formed from a material chosen so as to allow a selective etch of the oxide layer 10, the material preferably being TiN.

Formation of the Layer of the Second Block Copolymer

The second block copolymer 40, 41 of the layer 4 is advantageously selected from amongst:
polystyrene and polymethylmethacrylate, denoted PS-PMMA;
polystyrene and polylactic acid, denoted PS-PLA;
polystyrene and poly(ethylene oxide), denoted PS-PEO;
polystyrene and polydimethylsiloxane, denoted PS-PDMS;
polystyrene, polymethylmethacrylate, and poly(ethylene oxide), denoted PS-PMMA-PEO;
polystyrene and poly(2-vinyl pyridine), denoted PS-P2VP.

The third and fourth monomers 40, 41 of the second block copolymer 40, 41 are different compounds. On the other hand, the third monomer 40 of the second block copolymer 40, 41 may be identical to the first monomer 20 of the first block copolymer 20, 21. In the same way, the fourth monomer 41 of the second block copolymer 40, 41 may be identical to the second monomer 21 of the first block copolymer 20, 21.

The second neutralization layer $NL_2$ is preferably formed from a polymer having an identical affinity for each of the third and fourth monomers 40, 41. The second neutralization layer $NL_2$ is preferably grafted onto the structured layer 3. "Grafted" is understood to mean the formation of covalent bonds between the structured layer 3 and the chains of the polymer of the second neutralization layer $NL_2$. The molar weight of the polymer of the second neutralization layer $NL_2$ is advantageously chosen such that the second neutralization layer $NL_2$ has a thickness of less than 10 nm (preferably of the order of 5 nm). The step for formation of the second neutralization layer $NL_2$ may be executed by means of a heat treatment, such as an annealing, or by photoreticulation. By way of example, when the second block copolymer 40, 41 is polystyrene-b-poly(methylmethacrylate), denoted PS-b-PMMA, of lamellar form, the polymer of the second neutralization layer $NL_2$ is advantageously polystyrene-r-poly(methylmethacrylate), denoted PS-r-PMMA, preferably comprising 50% by weight of PS and 50% by weight of PMMA. The step for formation of the second neutralization layer $NL_2$ preferably begins by a spin-coating deposition. This spin-coating deposition may be executed by diluting the polymer of the second neutralization layer $NL_2$ in an organic solvent. When the polymer of the second neutralization layer $NL_2$ is PS-r-PMMA, the organic solvent may be polypropylene glycol monomethylic ether acetate, denoted PGMEA. The solution of the polymer of the second neutralization layer $NL_2$, diluted in the organic solvent, may have a concentration by weight of the order of 2%. The step for formation of the second neutralization layer $NL_2$ may continue by an annealing at a temperature of the order of 250° C. for a duration of the order of 2 minutes. The annealing may be executed on a heating table or in an oven. When the polymer of the second neutralization layer $NL_2$ can be reticulated, such an annealing allows the reticulation of said polymer. The step for formation of the second neutralization layer $NL_2$ may subsequently comprise a rinse step during which the surplus of polymer of the second neutralization layer $NL_2$ is removed by means of a solvent. When the polymer of the second neutralization layer $NL_2$ is PS-r-PMMA, the solvent is preferably PGMEA.

Figure 9A:
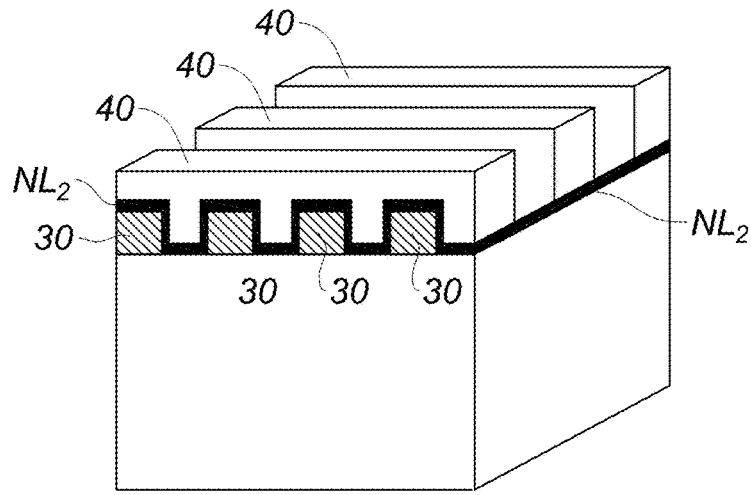
Figure 9B:
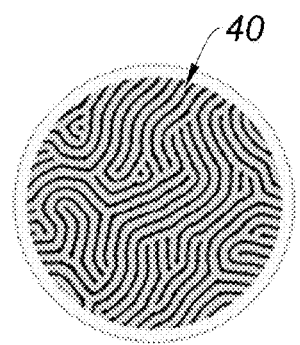
FIG. 9b, associated with FIG. 9a, is a partial schematic view from above illustrating the morphology of the second lithographic patterns.

The second block copolymer 40, 41 is preferably formed during the step e) with a lamellar morphology, the lamellae extending in the second direction. The molar weight of the second block copolymer 40, 41 is chosen in such a manner as to form, after self-assembly, periodic patterns (in the first direction) with a pitch in the range between 10 nm and 100 nm. The step e) is preferably executed by a spin-coating deposition. The spin-coating deposition may be executed by diluting the second block copolymer 40, 41 in an organic solvent. When the second block copolymer 40, 41 is formed from PS-b-PMMA, the organic solvent may be PGMEA. The solution of the second block copolymer 40, 41, diluted in the organic solvent, may have a concentration by weight of the order of 2%. The step e) comprises an annealing allowing the self-assembly of the second block copolymer PS-b-PMMA. The annealing is preferably executed at a temperature of the order of 220° C. for a duration of the order of 5 minutes. As illustrated in FIG. 9a, the step e) comprises a selective removal of the fourth monomer 41 of the second block copolymer 40, 41, here a selective removal of the PMMA in such a manner as to only conserve the series of second lithographic patterns 40 formed from PS. The selective removal of the PMMA may be executed according to an annealing, by exposing the layer 4 of the second block copolymer 40, 41 to ultraviolet radiation (e.g. at a wavelength of 172 nm), followed by a rinse with acetic acid or isopropanol. The selective removal of the PMMA may also be executed by means of a selective plasma.

Creation of the Second Mold

The step f) is executed by a technique known to those skilled in the art, such as described in Chapter 2 of the book "*Nano Lithography*", edited by Stefan Landis, ISBN: 978-1-118-62170-7.

Figure 10A:
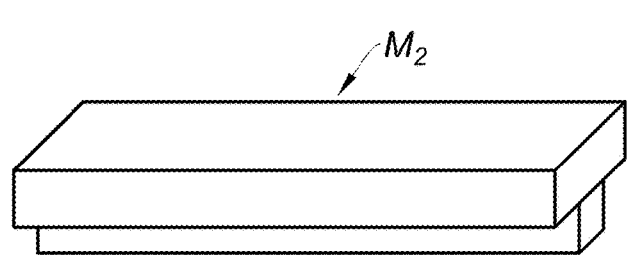
FIG. 10a is a perspective schematic view of a second mold created by a method according to the invention.
Figure 10B:
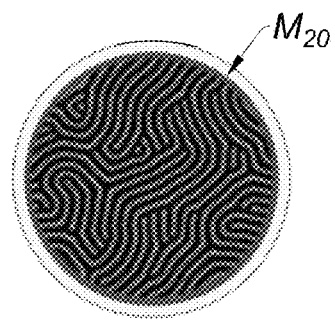
FIG. 10b, associated with FIG. 10a, is a partial schematic view illustrating the impressions of the second mold created.

The second mold $M_2$ (illustrated in FIG. 10*a*) is created during the step f) in a material of the polymer type. The impressions $M_{20}$ of the second mold $M_2$ are, by construction, perpendicular to the impressions $M_{10}$ of the first mold $M_1$. The first and second molds $M_1$, $M_2$ are advantageously equipped with alignment patterns arranged to facilitate their relative positioning (one with respect to the other), in such a manner as to reproduce the application of their perpendicular impressions $M_{10}$, $M_{20}$ onto various layers (e.g. a thermoplastic resin).

Figure 11A:
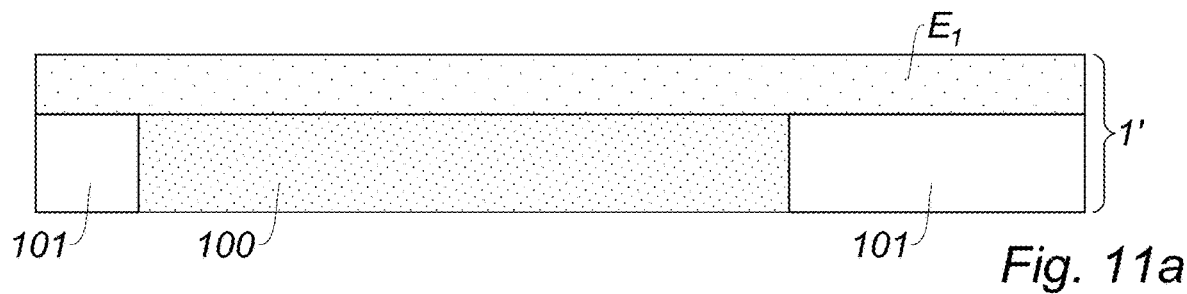
FIGS. 11a to 11h are cross-sectional schematic views illustrating various steps of a method for fabricating a computer according to the invention.
Figure 11B:
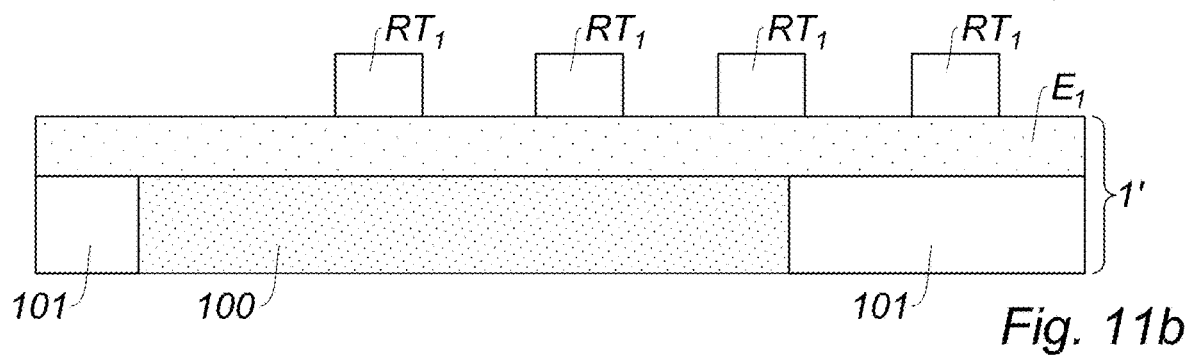
Figure 11C:
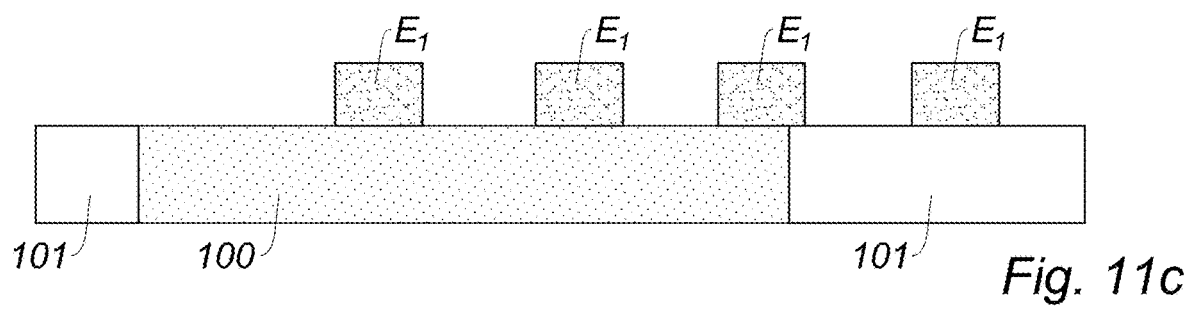
Figure 11D:
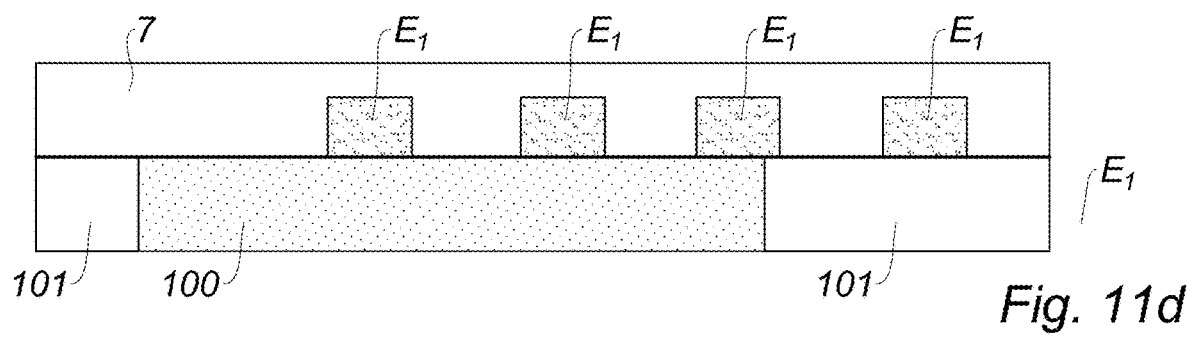
Figure 11E:
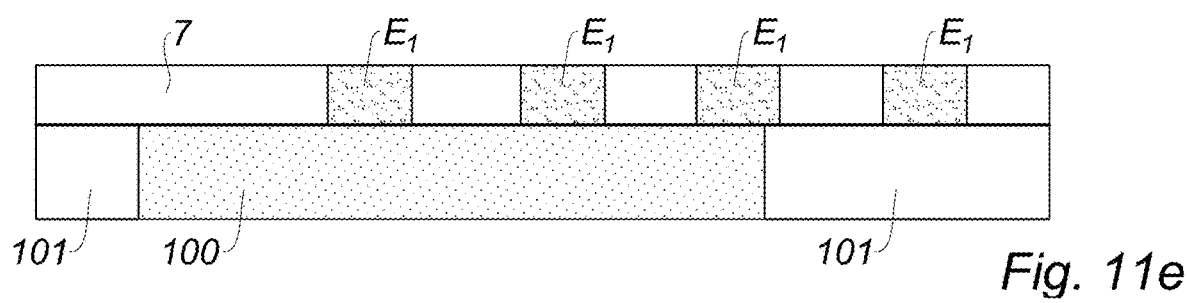
Figure 11F:
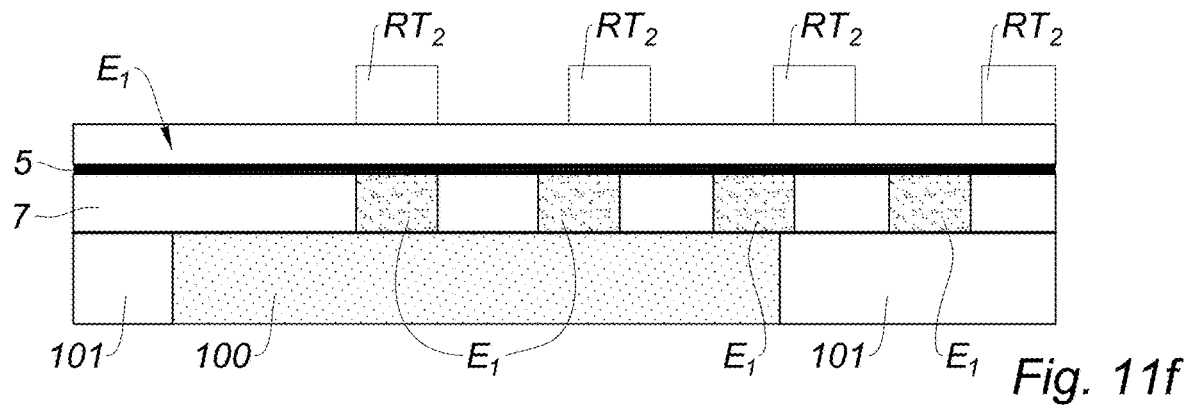
Figure 11G:
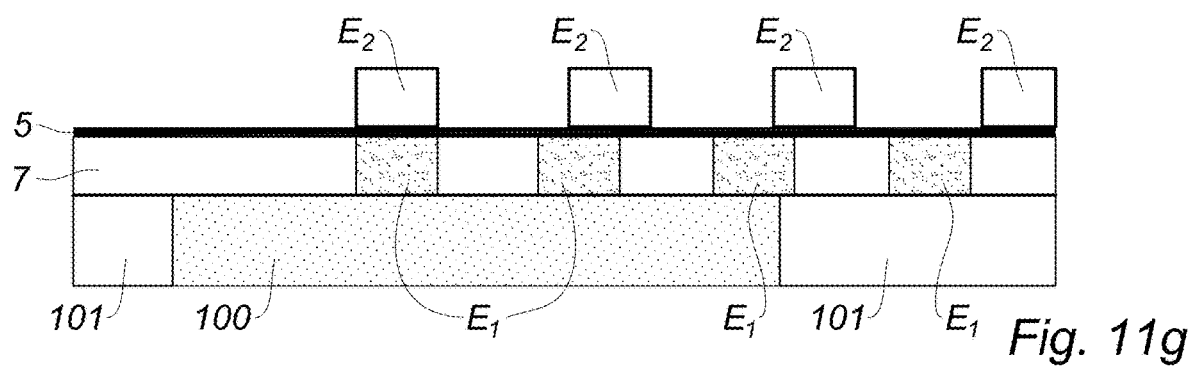
Figure 12A:
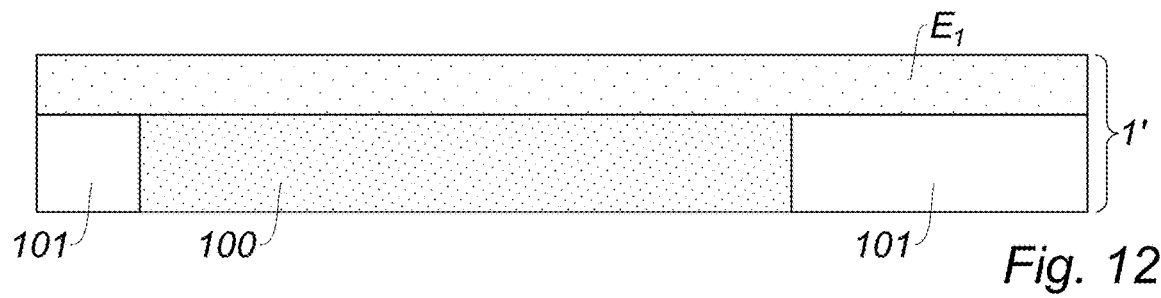
FIGS. 12a to 12g are cross-sectional schematic views illustrating various steps of a method for fabricating a computer according to the invention.
Figure 12B:
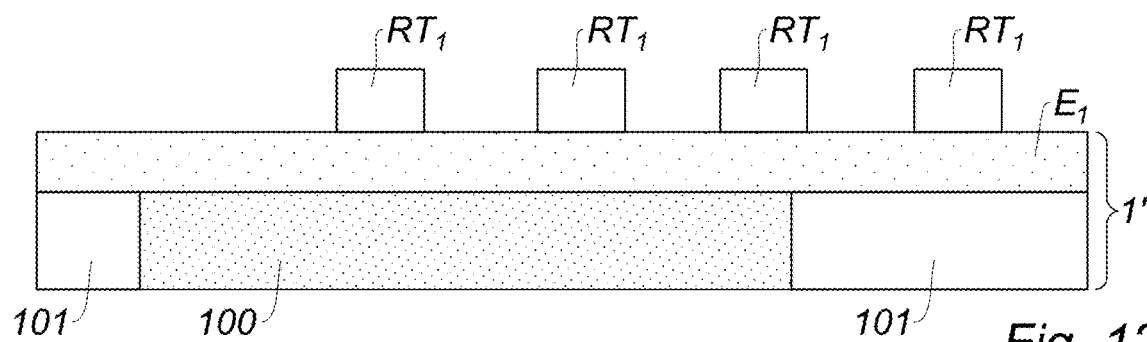
Figure 12C:
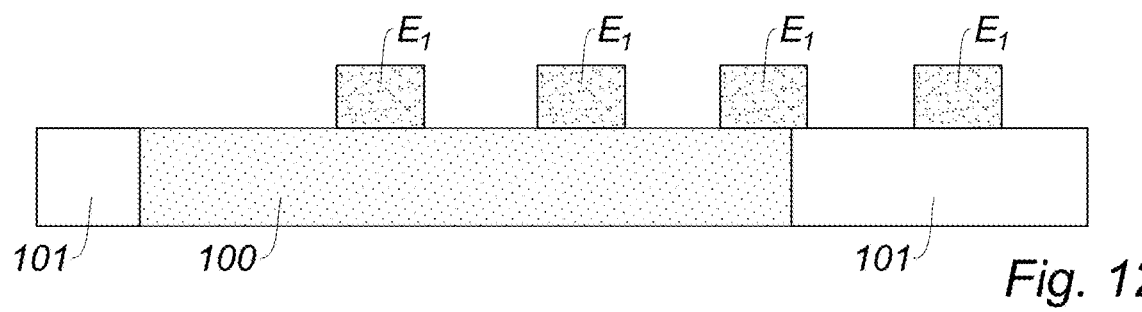
Figure 12D:
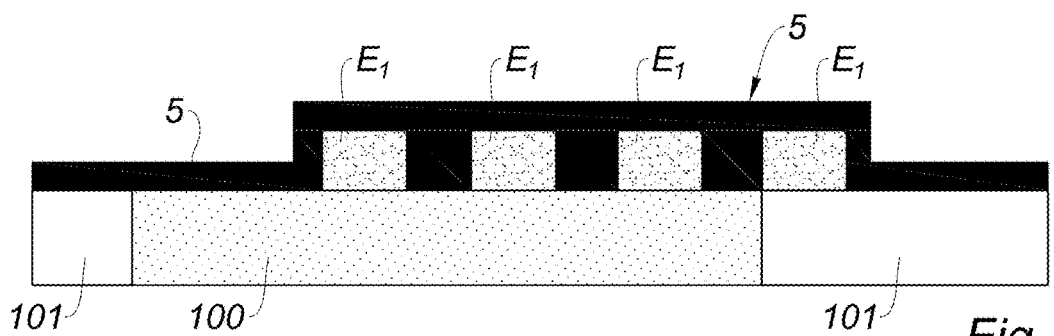
Figure 12E:
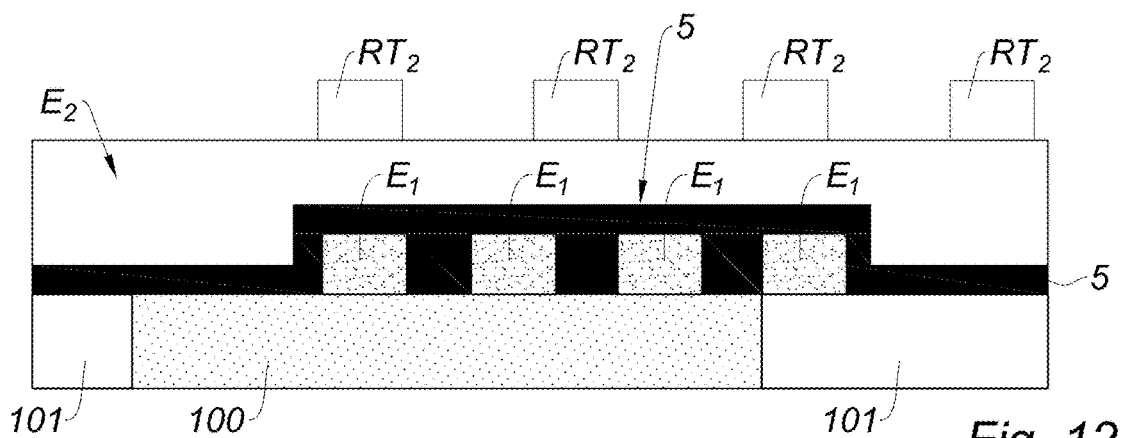
Figure 12F:
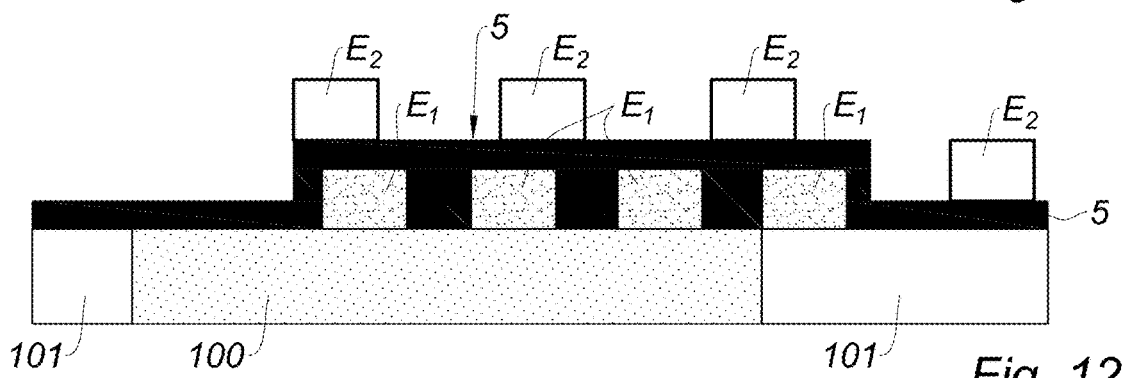

One subject of the invention is a method for fabricating a recurrent neural network computer C, comprising the successive steps:

a') provide a substrate 1' comprising a first electrode $E_1$ (illustrated in FIGS. 11*a* and 12*a*);

$b'_1$) deposit a thermoplastic resin $RT_1$ onto the first electrode $E_1$;

$b'_2$) apply the impressions $M_{10}$ of the first mold $M_1$, fabricated by a method according to the invention, onto the thermoplastic resin $RT_1$, at a temperature adapted to shape the thermoplastic resin $RT_1$;

$b'_3$) solidify the thermoplastic resin $RT_1$ shaped during the step $b'_2$), in such a manner as to obtain a lithography mask (illustrated in FIGS. 11*b* and 12*b*);

$b'_4$) etch the first electrode $E_1$ through the lithography mask obtained during the step $b'_3$), in such a manner as to structure the first electrode $E_1$;

$b'_5$) remove the thermoplastic resin $RT_1$ (the situation at the end of the step $b'_5$) as illustrated in FIGS. 11*c* and 12*c*);

c') form a memory layer 5, of the resistive memory type, on the first electrode $E_1$ structured during the step $b'_4$);

d') form a second electrode $E_2$ on the memory layer 5;

$e'_1$) deposit a thermoplastic resin $RT_2$ onto the second electrode $E_2$;

$e'_2$) apply the impressions $M_{20}$ of the second mold $M_2$, fabricated by a method according to the invention, onto the thermoplastic resin $RT_2$, at a temperature adapted to shape the thermoplastic resin $RT_2$, $e'_3$) solidify the thermoplastic resin $RT_2$ shaped during the step $e'_2$), in such a manner as to obtain a lithography mask (the situation at the end of the step $e'_3$) as illustrated in FIGS. 11*f* and 12*e*);

$e'_4$) etch the second electrode $E_2$ through the lithography mask obtained during the step $e'_3$), in such a manner as to structure the second electrode $E_2$;

$e'_5$) remove the thermoplastic resin $RT_2$ (the situation at the end of the step $e'_5$) as illustrated in FIGS. 11*g* and 12*f*).

Substrate Provided During the Step a')

The substrate 1' provided during the step a') preferably comprises a metallization layer 100 (for forming the contacts) and a layer of an oxide 101, such as $SiO_2$, or SiN. By way of non-limiting example, the metallization layer 100 may be a structure of the type Ti (10 nm)/AlCu (440 nm)/Ti (10 nm)/TiN (100 nm).

Formation and Structuring of the First Electrode

The first electrode $E_1$ is advantageously formed from at least one material selected from amongst Ti, TiN, Pt, Zr, Al, Hf, Ta, TaN, C, Cu, Ag. The first electrode $E_1$ may be formed from an alloy of these materials.

The first electrode $E_1$ preferably has a thickness in the range between 3 nm and 100 nm. By way of non-limiting examples, the first electrode $E_1$ may be formed on the substrate 1' by a physical vapor deposition (PVD), a chemical vapor deposition (CVD), or else by ALD (Atomic Layer Deposition).

By way of non-limiting example, the thermoplastic resin $RT_1$ deposited onto the first electrode $E_1$ during the step $b'_1$) may be a homopolymer polystyrene resin (hPS), preferably deposited by a spin-coating deposition.

The step $b'_4$) may be executed by a plasma etch. By way of non-limiting examples, it is possible to use $O_2$, Ar, $COH_2$, $N_2H_2$ as gas. The step $b'_4$) may also be executed by means of a UV treatment followed by a wet development (e.g. acetic acid).

The step $b'_5$) may be executed by a "stripping" technique known to those skilled in the art.

Formation of the Memory Layer

The memory layer 5 formed during the step c') is advantageously formed from at least one material selected from amongst $HfO_2$, $Al_2O_3$, $SiO_2$, ZrO, an oxide of titanium, a chalcogenide, $Ta_2O_5$. The memory layer 5 may be formed from a plurality of sub-layers formed from these materials. By way of non-limiting examples, the chalcogenide may be GeSe or GeSbTe.

The memory layer 5 advantageously has a thickness less than or equal to 10 nm.

Formation and Structuring of the Second Electrode

The second electrode $E_2$ is advantageously formed from at least one material selected from amongst Ti, TiN, Pt, Zr, Al, Hf, Ta, TaN, C, Cu, Ag. The second electrode $E_2$ may be formed from an alloy of these materials.

The second electrode $E_2$ preferably has a thickness in the range between 3 nm and 100 nm. By way of non-limiting examples, the second electrode $E_2$ may be formed on the memory layer 5 by a physical vapor deposition (PVD), a chemical vapor deposition (CVD), or else by ALD (Atomic Layer Deposition).

By way of non-limiting example, thermoplastic resin $RT_2$ deposited onto the second electrode $E_2$ during the step $e'_1$) may be a homopolymer polystyrene resin (hPS), preferably deposited by a spin-coating deposition.

The step $e'_2$) may be carried out by aligning the first and second molds $M_1$, $M_2$ by virtue of the alignment patterns provided for this purpose, such that the impressions $M_{20}$ of the second mold $M_2$ are applied perpendicularly to the structuring of the first electrode $E_1$.

The step $e'_4$) may be executed by a plasma etch. By way of non-limiting examples, it is possible to use $O_2$, Ar, $COH_2$, $N_2H_2$ as gas. The step $e'_4$) may also be executed by means of a UV treatment followed by a wet development (e.g. acetic acid).

The step $e'_5$) may be executed by a "stripping" technique known to those skilled in the art.

Encapsulation

Figure 11H:
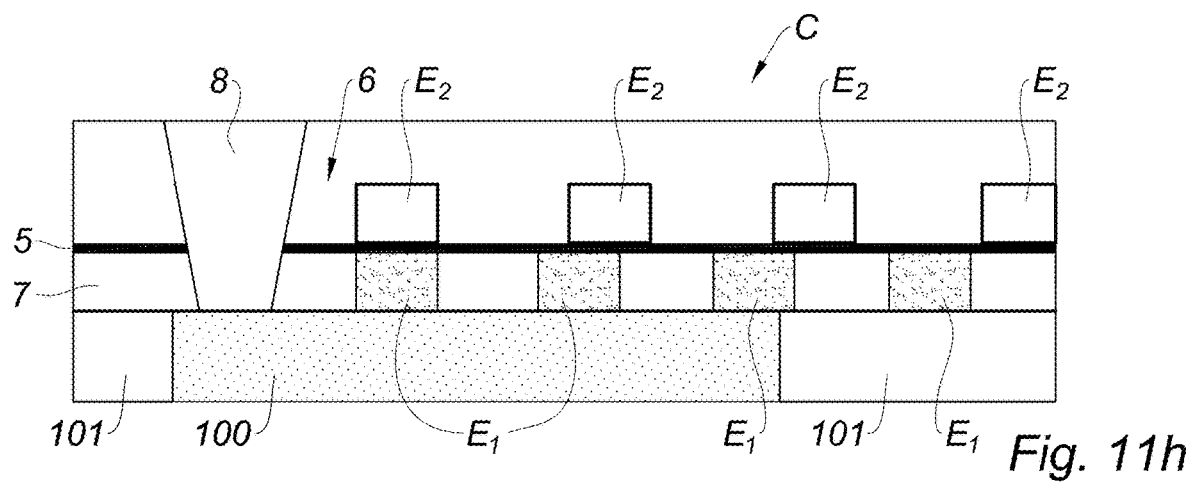
Figure 12G:
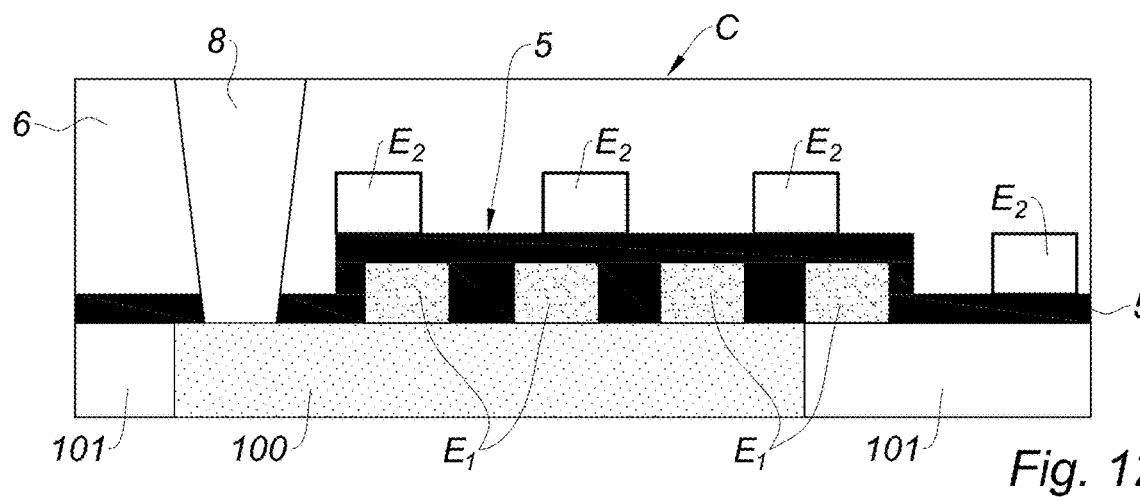

As illustrated in FIGS. 11*h* and 12*g*, the method advantageously comprises a step f') consisting in forming an encapsulation layer 6 on the second electrode $E_2$ structured during the step e'₄), the step f) being executed after the step e'₅). The encapsulation layer 6 is preferably a layer of an oxide, such as SiO₂, or SiN.

Furthermore, as illustrated in FIG. 11d, the method advantageously comprises a step b'₆) consisting in forming an encapsulation layer 7 on the first structured electrode E₁. The step b'₆) is executed after the step b'₅) and before the step c'). The encapsulation layer 7 is preferably a layer of an oxide, such as SiO_x, or SiN. As illustrated in FIG. 11e, the step b'₆) is advantageously followed by a step b'₇) for planarization of the encapsulation layer 7 which may be executed by chemical-mechanical polishing (or CMP). In the absence of the steps b'₆) and b'₇), the memory layer 5 formed during the step c') follows the topology of the first structured electrode E₁, as illustrated in FIG. 12d.

More precisely, in the absence of the steps b'₆) and b'₇), the memory layer 5 is formed during the step c'), directly on the substrate 1 and directly on the first structured electrode E₁, following the topology of the first structured electrode E1. This embodiment is particularly advantageous because it notably allows the method to forego the chemical-mechanical polishing step b'₇), which may prove to be difficult to carry out owing to the geometry of the first structured electrode E1 (the ratio between its thickness and its pitch being low).

In the absence of the steps b'₆) and b'₇), the memory layer 5 formed during the step c') advantageously has a thickness, denoted E, verifying:

$$p/2 \leq E \leq p$$

where p is the pitch of the first structured electrode E₁ forming a periodic structure. Such a thickness E of the memory layer 5 allows a quasi-plane surface topology to be obtained in such a manner as to facilitate the formation of the second electrode E₂ during the step d').

The pitch p of the first structured electrode E₁ corresponds to the pitch of the impressions M₁₀ of the first mold M₁, in other words to the pitch of the series of the first lithographic patterns 20. By way of non-limiting example, when the layer 2 of the first block copolymer 20, 21 formed during the step b) is formed from PS-PMMA, the pitch is defined by the molar weight of the first block copolymer 20, 21, as mentioned in the document Kim et al., "*Directed assembly of high molecular weight block polymers: highly ordered line patterns of perpendicularly oriented lamellae with large periods*", ACS Nano, 7(3), pp. 1952-60, 2013. The molar weight of the first block copolymer 20, 21 will be able to be chosen in such a manner as to control the pitch p of the first structured electrode E₁. By way of non-limiting example, the pitch p of the first structured electrode E₁ may be of the order of 20 nm.

In the absence of the steps b'₆) and b'₇), the memory layer 5 is advantageously formed from at least one material selected within the group comprising:

HfO_x, x<2;
Al₂O_x, x<3;
SiO_x, x<2;
ZrO_x, x<3;
TiO_x, x<2;
Ta₂O_x, x<5.

Such materials are sub-stoichiometric oxides allowing an electrically-conducting filament to be created when they are subjected to a high potential difference. Such materials can thus form, with the first and second structured electrodes E₁, E₂, a resistive memory.

Electrical Contacts

As illustrated in FIGS. 11h and 12g, the method preferably comprises a step g') consisting in forming an electrical contact pad 8, in contact with the metallization layer 100. The step g') is executed after the step f'). The step g') comprises a step for etching a part of the encapsulation layer 6 formed on the second structured electrode E₂.

The invention is not limited to the embodiments described. Those skilled in the art will be able to consider their technically-operative combinations, and to substitute equivalents for them.

The invention claimed is:

1. A method for fabricating first and second molds for lithography by nano-imprinting, comprising the steps:
   a) provide a substrate comprising a first neutralization layer;
   b) form a layer of a first block copolymer on the first neutralization layer by a technique of self-assembly, the first block copolymer comprising first and second monomers, the first neutralization layer having an identical affinity for each of the first and second monomers; then selectively remove the second monomer such that the layer of the first block copolymer comprises a series of first lithographic patterns with a random structure extending in a first direction, each of the first lithographic patterns being formed in the first monomer;
   c) create a first mold comprising impressions formed from the series of first lithographic patterns;
   d) provide a structured layer comprising a series of patterns, conforming to the series of first lithographic patterns and extending in the first direction, then coat the structured layer with a second neutralization layer;
   e) form a layer of a second block copolymer on the second neutralization layer by a technique of self-assembly, the second block copolymer comprising third and fourth monomers, the second neutralization layer having an identical affinity for each of the third and fourth monomers; then selectively remove the fourth monomer such that the layer of the second block copolymer comprises a series of second lithographic patterns with a random structure extending in a second direction perpendicular to the first direction, each of the second lithographic patterns being formed in the third monomer;
   f) create a second mold comprising impressions formed from the series of second lithographic patterns.

2. The method as claimed in claim 1, wherein the substrate provided during the step a) is coated with an oxide layer on which the first neutralization layer is formed; and the step c) is preceded by a step c₀) consisting in etching the first neutralization layer and the oxide layer through the series of first lithographic patterns.

3. The method as claimed in claim 1, wherein the structured layer provided during the step d) has a thickness in the range between 5 nm and 15 nm.

4. The method as claimed in claim 1, wherein the step d) comprises the steps:
   d₀) provide a layer, intended to be structured, on a carrier substrate;
   d₁) deposit a thermoplastic resin onto the layer;
   d₂) apply the impressions of the first mold created during the step c) to the thermoplastic resin, at a temperature adapted to shape the thermoplastic resin;
   d₃) solidify the thermoplastic resin shaped during the step d₂), in such a manner as to obtain a lithography mask;

d$_4$) etch the layer through the lithography mask obtained during the step d$_3$), in such a manner as to structure the layer.

5. The method as claimed in claim 2, wherein the step d) comprises the steps:
- D$_0$) provide a layer, intended to be structured, sandwiched between the substrate and the oxide layer;
- D$_1$) eliminate the series of first lithographic patterns and the first neutralization layer, the step D$_1$) being executed after the step c$_0$) such that the oxide layer etched during the step c$_0$) forms a lithography mask;
- D$_2$) etch the layer through the lithography mask formed during the step D$_1$), in such a manner as to structure the layer;
- D$_3$) remove the oxide layer.

6. The method as claimed in claim 5, wherein the layer provided during the step D$_0$) is formed from a material chosen so as to allow a selective etch of the oxide layer.

7. The method as claimed in claim 1, wherein the first and second block copolymers are selected from amongst:
- polystyrene and polymethylmethacrylate, denoted PS-PMMA;
- polystyrene and polylactic acid, denoted PS-PLA;
- polystyrene and poly(ethylene oxide), denoted PS-PEO;
- polystyrene and polydimethylsiloxane, denoted PS-PDMS;
- polystyrene, polymethylmethacrylate, and poly(ethylene oxide), denoted PS-PMMA-PEO;
- polystyrene and poly(2-vinyl pyridine), denoted PS-P2VP.

* * * * *